United States Patent
Wang et al.

(10) Patent No.: US 8,236,102 B1
(45) Date of Patent: Aug. 7, 2012

(54) HYDROTHERMAL METHODS OF FABRICATING TRIVALENT-METAL-ION-DOPED SAPPHIRE CRYSTALS

(75) Inventors: Buguo Wang, Burlington, MA (US); David F. Bliss, Arlington, MA (US); Michael J. Callahan, Hanson, MA (US)

(73) Assignee: Solid State Scientific Corporation, Hollis, NH (US)

( * ) Notice: Subject to any disclaimer, the term of this patent is extended or adjusted under 35 U.S.C. 154(b) by 590 days.

(21) Appl. No.: 12/321,763

(22) Filed: Jan. 24, 2009

Related U.S. Application Data

(60) Provisional application No. 61/062,984, filed on Jan. 30, 2008.

(51) Int. Cl.
*C30B 7/00* (2006.01)
*C30B 21/02* (2006.01)
*C30B 28/06* (2006.01)

(52) U.S. Cl. ......... 117/71; 117/12; 117/950; 423/594.1; 423/594.8; 423/598; 423/600; 423/607

(58) Field of Classification Search ...... 117/71
See application file for complete search history.

(56) References Cited

U.S. PATENT DOCUMENTS

| | | | | |
|---|---|---|---|---|
| 2,979,413 A | * | 4/1961 | Ballman et al. | 117/71 |
| 3,805,044 A | * | 4/1974 | Bhattacharyya et al. | 117/71 |
| 4,382,840 A | * | 5/1983 | Chai et al. | 117/71 |
| 4,481,069 A | * | 11/1984 | Chai et al. | 117/71 |
| 4,559,208 A | * | 12/1985 | Chai et al. | 117/224 |
| 4,578,146 A | * | 3/1986 | Chai et al. | 117/71 |
| 6,841,000 B2 | * | 1/2005 | McCandlish et al. | 117/71 |
| 2009/0151621 A1 | * | 6/2009 | Kolis et al. | 117/71 |

OTHER PUBLICATIONS

Laudise, R.A. and Ballman, A.A. "Hydrothermal Synthesis of Sapphire" J. Am. Chem. Soc. 80:2655-57 (1958).*

* cited by examiner

*Primary Examiner* — Jessica L Ward
*Assistant Examiner* — Ross J Christie
(74) *Attorney, Agent, or Firm* — Louis J. Franco; Law Office of Louis J. Franco

(57) ABSTRACT

A method of hydrothermally synthesizing sapphire single crystals doped with trivalent metal ions in a crystal-growth autoclave including a crystal-growth zone and nutrient-dissolution zone in fluid communication with the crystal-growth zone is provided. Implementations of the method including situating within the crystal-growth zone at least one sapphire-based seed crystal and situating within the nutrient-dissolution zone an aluminum-containing material to serve as nutrient. An acidic, trivalent-metal-ion-containing growth solution is introduced into the cavity in a quantity sufficient, at least when heated to a predetermined average temperature, to immerse the at least one seed crystal and the nutrient in the growth solution. The growth solution is selected such that sapphire exhibits retrograde solubility therein and the growth process is carried out while maintaining an interior-cavity pressure within a range between and including each of 3.5 kilopounds per square inch and 25 kilopounds per square inch and while maintaining a temperature differential between the crystal-growth and nutrient-dissolution zones such that the average temperature within the crystal-growth zone is higher than the average temperature within the nutrient-dissolution zone.

19 Claims, 1 Drawing Sheet

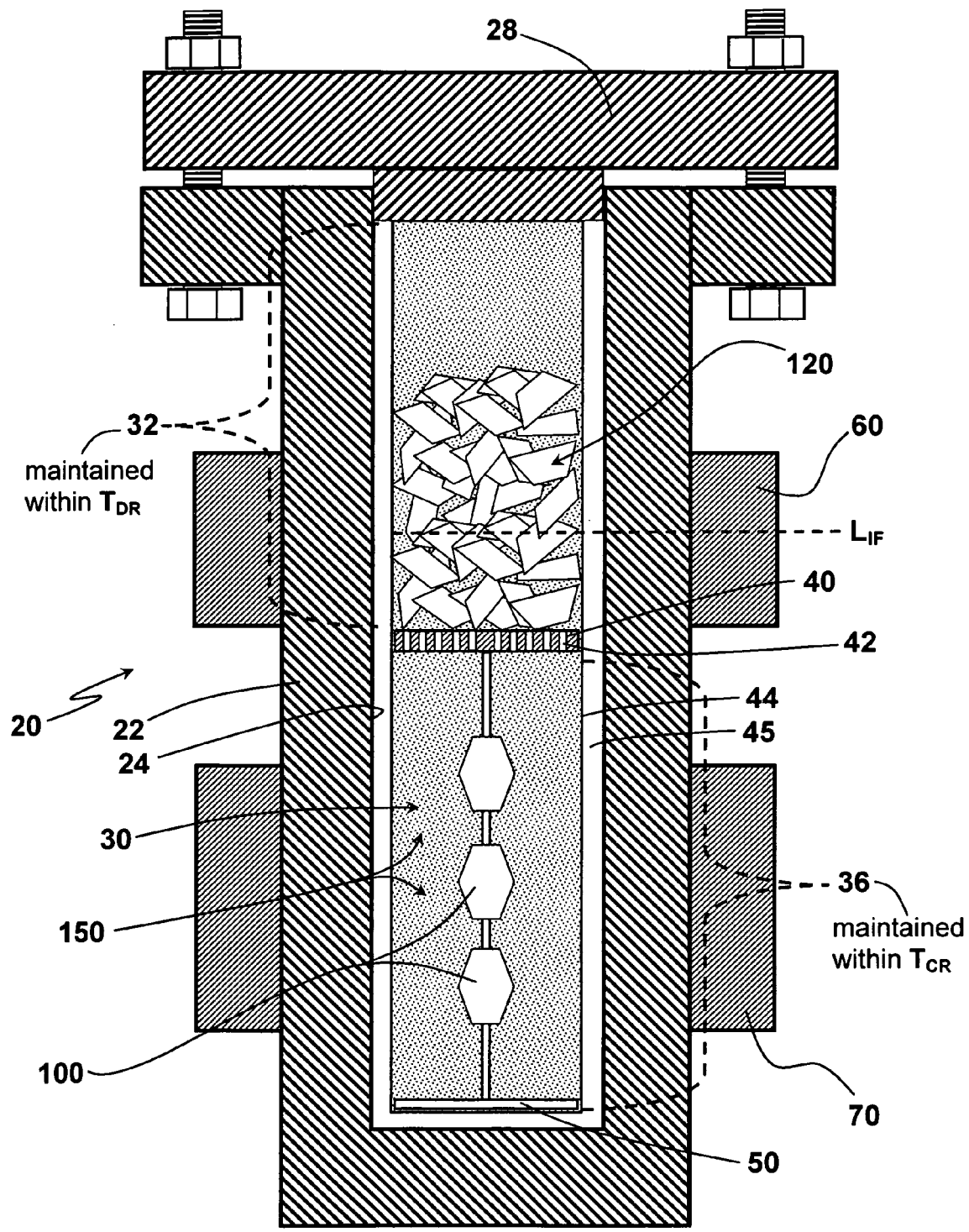

HYDROTHERMAL METHODS OF FABRICATING TRIVALENT-METAL-ION-DOPED SAPPHIRE CRYSTALS

PROVISIONAL PRIORITY CLAIM

Priority based on Provisional Application Ser. No. 61/062,984, filed Wednesday, Jan. 30, 2008, and entitled "HYDROTHERMAL METHODS OF FABRICATING TRIVALENT-METAL-ION-DOPED SAPPHIRE CRYSTALS," is claimed.

STATEMENT OF UNITED STATES GOVERNMENT RIGHTS IN THE INVENTION

This invention was made with U.S. Government support under contract F19628-03-C-0114-1 awarded by the United States Air Force. The U.S. Government has certain rights in this invention.

BACKGROUND

Sapphire crystals doped with transition metals such as chromium, vanadium and titanium have attracted the attention of scientists and engineers for many years primarily because of their applicability as high-power laser media and secondarily because of there marketability as synthetic gemstones. As a tunable laser medium, for example, transition-metal-doped sapphire crystals must exhibit a uniform trivalent dopant distribution. High quality titanium-doped sapphire single crystals, for instance, can produce high-power tunable lasers in the wavelength range of 670-1100 nm, and also provide pink synthetic gem stone.

Presently, Ti: Sapphire crystals are produced primarily by a method known as melt growth at very high temperatures often exceeding 2000° C. Melt growth inherently produces low quality crystals with high defect densities attributable to the high growth temperature. Additional drawbacks attendant to melt growth include high stress within the crystal and non-uniform distribution of the selected dopant(s).

Accordingly, there exists a need for a method, alternative to melt growth, for synthesizing sapphire crystals doped with trivalent transition metals including at least one of chromium, vanadium and titanium.

SUMMARY

Various methods of hydrothermally synthesizing sapphire single crystals uniformly doped with trivalent metal ions are implemented in a crystal-growth autoclave having a chamber wall defining an interior cavity. The interior cavity includes a crystal-growth zone and a nutrient-dissolution zone that, in accordance with the invention, is typically situated above the crystal-growth zone. Irrespective of whether, in any particular implementation, the interior cavity is oriented such that nutrient-dissolution zone is higher than the crystal-growth zone, the nutrient-dissolution and crystal-growth zones are situated in mutual fluid communication, although, in some implementations, the aforementioned zones may be separated by a porous baffle. In alternative implementations, the trivalent metal ions with which the sapphire is doped include at least one of titanium ($Ti^{3+}$), chromium ($Cr^{3+}$), iron ($Fe^{3+}$) and vanadium ($V^{3+}$). In some versions, sapphire crystals are co-doped with at least two of titanium ($Ti^{3+}$), chromium ($Cr^{3+}$), iron ($Fe^{3+}$) and vanadium ($V^{3+}$).

An illustrative implementation in which sapphire is doped with trivalent titanium ($Ti^{3+}$) includes disposing within the crystal-growth zone at least one sapphire-based seed crystal and disposing within the nutrient-dissolution zone an aluminum-containing material to serve as nutrient. In illustrative alternative versions, the sapphire-based seed crystal is one of (i) pure sapphire grown by any of various techniques and (ii) titanium-doped sapphire single crystals grown by, for example, a previous hydrothermal process. In the preceding sentence, "previous hydrothermal process" does not refer to hydrothermal processes developed by others prior to the current process, but to the fabrication of the titanium-doped sapphire single crystals prior to their use as seeds in the process being described. In one version, solid titanium-doped sapphire (e.g., $Ti^{3+}:Al_2O_3$) is situated in the nutrient-dissolution zone and serves as the sole nutrient.

In a version in which titanium-doped sapphire serves as the sole nutrient, a solution of hydrochloric acid (HCl) is introduced into the cavity in a quantity sufficient to immerse the at least one seed crystal and the nutrient in the growth solution when the solution is heated to a predetermined average temperature within a predetermined process-temperature range at which the hydrothermal synthesis is to occur. In other words, the cavity is initially only partially filled while the solution and apparatus are at or near standard atmospheric pressure and room temperature. The amount of solution initially introduced into the cavity is calculated to allow for heating and expansion of the solution to a super-critical state within the confines of the sealed cavity, at which point the super-critical fluid occupies the entirety of the cavity such that the seed crystals and nutrient are immersed in the super-critical growth solution. In a typical case, the necessary immersion occurs when the cavity is initially filled with solution to between 50% and 90% cavity capacity at, for example, room temperature and standard atmospheric pressure. As the HCl solution is heated, it dissolves the titanium-doped sapphire and forms an acidic, titanium-containing growth solution. In an alternative version, solid sapphire ($Al_2O_3$) is disposed as solid nutrient in the nutrient-dissolution zone. Typically, in accordance with the latter version, the solid sapphire nutrient and the seed crystal are immersed in an acidic growth (e.g. HCl) solution including $TiCl_3(aq)$, which serves as the source of $Ti^{3+}$. In either of the aforesaid illustrative versions, an aqueous, HCl-containing growth solution transports oxygen, aluminum, and titanium ($Ti^{3+}$) ions to the crystal-growth zone where these substances initially attach to appropriate lattice sites on the seed crystal and, as the process continues, proliferate the basic structure defined by the seed crystal. Based on the teachings included in the current disclosure, those of skill in the related arts will appreciate that alternative growth solutions can be employed to achieve the desired results. For instance, in one alternative implementation, $Ti_2O_3$ is used as the source of $Ti^{3+}$ ions.

As with hydrothermal synthesis generally, implementations of the present invention prescribe the maintenance of an interior-cavity pressure well above atmospheric pressure and a temperature gradient between the nutrient-dissolution and crystal-growth zones. In a typical growth process within the scope and contemplation of the invention, interior-cavity pressure is maintained within a range between, and including each of, 3.5 kilopounds per square inch and 25 kilopounds per square inch. Implementations of the invention depart from prior hydrothermal crystal-growth processes insofar as variations of the current methods prescribe temperature differentials in which the average temperature within the crystal-growth zone is higher than the average temperature within the nutrient-dissolution zone. This "inverted" temperature gradient is reflective of the observation that, in various growth solutions prepared in accordance with the inventive methods, pure sapphire crystals, and sapphire crystals doped with trivalent metal ions, exhibit retrograde solubility. That is, within certain prescribed growth solutions, they crystallize at higher temperatures than the temperatures at which they dissolve. In implementations in which the autoclave is vertically oriented, the aforementioned retrograde solubility is also reflected in the physical inversion of the nutrient-dissolution and crystal-growth zones relative to the manner in which the nutrient-dissolution and crystal-growth zones are typically oriented for hydrothermal crystal growth.

Representative, non-limiting implementations are more completely described and depicted in the following detailed description in conjunction with the accompanying drawings.

BRIEF DESCRIPTION OF THE DRAWINGS

FIG. 1 is a schematic representation of the apparatus and materials used in an illustrative hydrothermal crystal-growth process.

DETAILED DESCRIPTION

The following description of methods for hydrothermally synthesizing sapphire single crystals doped with trivalent metal ions is illustrative in nature and is therefore not intended to limit the scope of the invention or its application of uses. Accordingly, the various implementations, aspects, versions and embodiments described in the summary and detailed description are in the nature of non-limiting examples falling within the scope of the appended claims and do not serve to define the maximum scope of the claims.

Illustrative crystal-growth processes are explained with reference to FIG. 1. Schematically depicted in FIG. 1 are the apparatus and materials used in an illustrative growth process. A crystal-growth autoclave 20 has at least one chamber wall 22 with an inner surface 24 defining an interior cavity 30. The interior cavity 30 includes a nutrient-dissolution zone 32 and a crystal-growth zone 36 situated below the nutrient-dissolution zone 32. A baffle 40 is situated between the nutrient-dissolution and crystal-growth zones 32 and 36 and includes apertures 42 in order to facilitate mutual fluid communication between the nutrient-dissolution and crystal-growth zones 32 and 36.

A crystal-growth autoclave such as the autoclave 20 of FIG. 1 is typically made of thick-walled steel in order to withstand high temperatures and pressures. Because, as in the current processes, highly corrosive solutions are introduced into the interior cavity 30 as part of the crystal-growth process, a protective insert 44 (or liner) is situated within the interior cavity 30 in order to isolate the growth environment from the inner surface 24 of each of the at least one chamber walls 22. In some versions, the protective insert 44 exhibits an external configuration and dimensions complimentary to those of the interior cavity 30 such that the insert 44 fits snugly into the interior cavity 30 with its exterior surfaces in direct contacting engagement with the inner surface 24 of each of the at least one chamber walls 22. Inserts of the aforementioned type are referred to in the industry as "contact-type" inserts. An alternative type of protective insert 44 is known as a "floating-type" insert because it is dimensioned so as to occupy less than the entirety of the interior cavity 30. Alternative versions of the present processes are carried out with the use of either of the aforementioned types of inserts. For illustrative purposes, the insert 44 depicted in FIG. 1 is of the floating type. A fluid 45 in the form of a liquid (e.g., water) is introduced between the exterior of the protective insert 44 and the inner surface(s) 24 of the chamber wall(s) 22 in order to counter-balance the outwardly-directed pressure that will be applied to the insert 44 when solution introduced into the insert 44 is sealed therein and heated, as described elsewhere in the present specification. Alternative materials from which protective inserts 44 are generally fabricated include carbon-free iron, copper, silver, gold, platinum, titanium, glass and quartz. However, for purposes of the current methods, a platinum or gold insert 44 is recommended.

Referring still to FIG. 1, a seed rack 50 is placed in the crystal-growth zone and retains sapphire-based seed crystals 100. Illustrative sapphire-based seed crystals 100 include pure sapphire ($Al_2O_3$) and sapphire-based crystals doped with trivalent metal ions, which are generically denoted as $M^{3+}$. In cases in which the seed crystals 100 are doped with trivalent metal ions, the particular metal ions are indicated by the final product desired. Because sapphire doped with trivalent ions of titanium, chromium, iron and vanadium are of particular industrial interest, owing to their potential for optical emission, the sapphire-based seed crystals 100 used in alternative implementations are doped with at least one of titanium ($Ti^{3+}$), chromium ($Cr^{3+}$), iron ($Fe^{3+}$) and vanadium ($V^{3+}$) in order to facilitate the hydrothermal crystal growth of, respectively, titanium (III)-doped sapphire ($Ti^{3+}:Al_2O_3$), chromium (III)-doped sapphire ($Cr^{3+}:Al_2O_3$), iron (III)-doped sapphire, and vanadium (III)-doped sapphire ($V^{3+}:Al_2O_3$).

Initially situated within the nutrient-dissolution zone 32 is a quantity of aluminum-containing solid nutrient 120. In one version, trivalent-metal-ion-doped solid sapphire ($M^{3+}:Al_2O_3$) is situated in the nutrient-dissolution zone 32 and serves as the sole nutrient. In addition to serving as a source of aluminum ions when dissolved, the trivalent-metal-ion-doped solid sapphire ($M^{3+}:Al_2O_3$) provides a source of the trivalent metal ions $M^{3+}$ needed to grow the desired doped sapphire crystal. In alternative implementations, the trivalent-metal-ion-doped sapphire nutrient 120 includes at least one of titanium (III)-doped sapphire ($Ti^{3+}:Al_2O_3$), chromium (III)-doped sapphire ($Cr^{3+}:Al_2O_3$), iron (III)-doped sapphire ($Fe^{3+}:Al_2O_3$), and vanadium (III)-doped sapphire ($V^{3+}:Al_2O_3$).

In order to facilitate dissolution of the solid nutrient 120 and the transport of ions obtained therefrom to the surfaces of the seed crystals 100 upon which additional growth is to be induced, an acidic growth solution 150 is introduced into the interior cavity 30. The growth solution 150 comprises three components: (i) a solvent, (ii) a mineralizer and (iii) a solute. In a hydrothermal process, the solvent is water by definition. In various alternative implementations, the mineralizer is an acid compound that, when dissolved in the water, forms an acidic solution 145. Although various acids (acidic solutions 145) will facilitate the desired effect, and processes employing alternative acids are within the scope and contemplation of the invention, solutions 145 of hydrochloric acid (HCl) have proven suitable. Because the acidic solution 145 is heated after the autoclave 20 is sealed, expansion of the acidic solution 145 is taken into account in determining the quantity of acidic solution 145 introduced into the interior cavity 30 prior to sealing the autoclave 20. More specifically, as shown in FIG. 1, a quantity of acidic solution 145 is added to a predetermined initial fill level $L_{IF}$. In a typical version, the interior cavity 30 is initially filled with acidic solution 145 to between approximately 50% and 90% of its total volumetric capacity when the autoclave closure 28 is sealed. The volume of acidic solution 145 initially introduced depends on parameters such as a predetermined average temperature $T_A$ within a predetermined process-temperature range $T_R$ at which the hydrothermal synthesis is to occur. Also considered is the desired pressure for the particular growth cycle; the higher the desired pressure for a given predetermined process-temperature range $T_R$, the greater the volume of acidic solution 145 initially introduced into the interior cavity 30. Ultimately, when the autoclave 20 is sealed, and the acidic solution 145 is heated, the volume of the acidic solution 145 increases. Moreover, as the acidic solution 145 is heated, the aluminum-containing nutrient 120 situated in the nutrient-dissolution zone 32 begins to is dissolve and contribute aluminum ions to the acidic solution 145, thereby forming growth solution 150. In versions in which the aluminum-containing nutrient 120 is doped with trivalent metal ions $M^{3+}$, the aluminum-containing nutrient 120 also serves as a source of dopant (i.e., ions $M^{3+}$) for inclusion in the synthesized crystals. The predetermined process-temperature range $T_R$ is typically defined such that the growth solution 150 is heated to a super-critical state, at which point the super-critical growth solution 150 occupies the entirety of the interior cavity 30 and is at a pressure substantially above 1 atmosphere.

In alternative versions, non-doped solid sapphire ($Al_2O_3$) is disposed as solid nutrient 120 in the nutrient-dissolution zone 32. In such a version, the solid sapphire nutrient 120 and the seed crystal(s) 100 are immersed in an acidic growth solution 150 prepared initially so as to include a source of trivalent metal ions $M^{3+}$ (e.g., $Ti^{3+}$, $Cr^{3+}$, $Fe^{3+}$, and $V^{3+}$). In a first illustrative implementation, an HCl-containing growth solution 150 includes an aqueous additive of the general form M-trichloride (e.g., $TiCl_3$, $CrCl_3$, etc.) while in a second illustrative implementation, an additive of the form $M_2O_3$ (e.g. $T_2O_3$, $Cr_2O_3$, etc.) is used at the source of the desired trivalent metal ions $M^{3+}$.

As discussed in the summary, hydrothermal crystal growth is performed at pressures far above atmospheric pressure. Pressure within the interior cavity 30 is a function of (i) the volume of acidic solution 145 initially introduced into the interior cavity 30 as a percent of overall volumetric capacity of the cavity 30 and (ii) the temperature range $T_R$ within which the crystal synthesis is conducted. In a typical growth process within the scope and contemplation of the invention, interior-cavity pressure is to maintained within a range between and including each of 3.5 kilopounds per square inch (kpsi) and 25 kpsi.

A temperature gradient is maintained within the interior cavity 30 so that dissolution of nutrient 120 is promoted in the nutrient-dissolution zone 32 and crystallization of ions onto the seed crystal(s) 100 is promoted in the crystal-growth zone 100. Referring to the illustrative apparatus depicted in FIG. 1, a first heating element 60 annularly disposed about the chamber wall(s) 22 maintains the growth solution 150 in the nutrient-dissolution zone 32 within a predetermined dissolution-temperature range $T_{DR}$. A second heating element 70, also annularly disposed about the chamber wall(s) 22, maintains the growth solution 150 in the crystal-growth zone 36 within a predetermined crystallization-temperature range $T_{CR}$. Because methods within the scope of the invention prescribe the use of acidic growth solutions 150 in which non-doped sapphire and sapphire doped with trivalent metal ions $M^{3+}$ exhibit retrograde solubility, the average temperature within the crystallization-temperature range $T_{CR}$ is higher than the average temperature within the dissolution-temperature range $T_{DR}$. In implementations in which the autoclave 30 is vertically oriented, the aforementioned retrograde solubility also indicates a physical inversion of the nutrient-dissolution and crystal-growth zones 32 and 36 relative to the manner in which the nutrient-dissolution and crystal-growth zones 32 and 36 are typically arranged for hydrothermal crystal growth. More specifically, in a typical hydrothermal growth process employing a vertically oriented autoclave, the hotter nutrient-dissolution zone is situated below the cooler crystal-growth zone. However, it is to be understood that, just as in previous hydrothermal processes, processes within the scope of the current invention can be implemented in autoclaves 30 that are disposed in a non-vertical (e.g. horizontal) orientation.

The concentration of dopant (i.e., trivalent metal ions $M^{3+}$) incorporated into the crystal grown on the seed crystal(s) 100 is a function of the adjustable parameters of (i) interior cavity pressure, (ii) dissolution-temperature range $T_{DR}$, and (iii) crystallization-temperature range $T_{CR}$. Within the previously prescribed interior-cavity pressure range of between and including each of 3.5 kpsi and 25 kpsi, adjustment of the dissolution-temperature and crystallization-temperature ranges $T_{DR}$ and $T_{CR}$ can vary the dopant concentrations from a few parts per million (ppm) to several percent. In various implementations, the temperature within the nutrient-dissolution zone 32 is maintained at an average within a dissolution-temperature range $T_{DR}$ between and including each of 260° C. and 550° C. The temperature within the crystal-growth zone 36 is maintained at an average within a crystallization-temperature range $T_{CR}$ between and including each of 400° C. and 700° C. In various versions, the average temperature differential between the average temperatures of the crystal-growth and nutrient-dissolution zones is maintained within a range between and inclusive of each of 5° C. and 100° C.

The foregoing is considered to be illustrative of the principles of the invention. Furthermore, since modifications and changes to various aspects and implementations will occur to those skilled in the art without departing from the scope and spirit of the invention, it is to be understood that the foregoing does not limit the invention as expressed in the appended claims to the exact constructions, implementations and versions shown and described.

What is claimed is:

1. In a crystal-growth autoclave having a chamber wall defining an interior cavity including a crystal-growth zone and a nutrient-dissolution zone situated in fluid communication with the crystal-growth zone, a method of hydrothermally synthesizing sapphire single crystals doped with trivalent metal ions comprising the steps of:
   situating within the crystal-growth zone at least one sapphire-based seed crystal;
   to situating within the nutrient-dissolution zone an aluminum-containing material to serve as nutrient;
   introducing into the cavity an acidic, trivalent-metal-ion-containing growth solution sufficient in quantity to immerse the at least one seed crystal and the nutrient in the growth solution when the solution is heated to a predetermined average temperature within a predetermined process-temperature range;
   maintaining an interior-cavity pressure within a range between and including each of 3.5 kilopounds per square inch and 25 kilopounds per square inch; and
   maintaining a temperature differential between the crystal-growth and nutrient-dissolution zones such that the average temperature within the crystal-growth zone is higher than the average temperature within the nutrient-dissolution zone;
   wherein the acidic, trivalent-metal-ion-containing growth solution is selected such that sapphire exhibits retrograde solubility in the solution.

2. The method of claim 1 wherein the trivalent metal ions comprise at least one of titanium ($Ti^{3+}$), chromium ($Cr^{3+}$), iron ($Fe^{3+}$) and vanadium ($V^{3+}$).

3. The method of claim 2 wherein the at least one sapphire-based seed crystal comprises at least one of (a) pure sapphire and (b) sapphire-based crystal doped with at least one of titanium ($Ti^{3+}$), chromium ($Cr^{3+}$), iron ($Fe^{3+}$) and vanadium ($V^{3+}$).

4. The method of claim 3 wherein the material selected as nutrient comprises at least one of (a) sapphire ($Al_2O_3$), (b) titanium (III) sapphire ($Ti^{3+}:Al_2O_3$), (c) chromium (III) sapphire ($Cr^{3+}:Al_2O_3$), (d) iron (III) sapphire ($Cr^{3+}:Al_2O_3$), and (e) vanadium (III) sapphire ($V^{3+}:Al_2O_3$).

5. The method of claim 4 wherein the acidic growth solution comprises hydrochloric acid.

6. The method of claim 2 wherein the material selected as nutrient comprises at least one of (a) sapphire ($Al_2O_3$), (b) titanium (III) sapphire ($Ti^{3+}:Al_2O_3$), (c) chromium (III) sapphire ($Cr^{3+}:Al_2O_3$), (d) iron (III) sapphire ($Cr^{3+}:Al_2O_3$), and (e) vanadium (III) sapphire ($V^{3+}:Al_2O_3$).

7. The method of claim 6 wherein the acidic growth solution comprises hydrochloric acid.

8. The method of claim 2 wherein the acidic growth solution comprises hydrochloric acid.

9. The method of claim 2 wherein the average temperature differential between the average temperatures of the crystal-growth and nutrient-dissolution zones is maintained within a range of 5° C. and 100° C.

10. The method of claim 2 wherein the average temperature within the crystal-growth zone is maintained within a range between and including each of 400° C. and 700° C. and the average temperature within the nutrient-dissolution zone is maintained within a range between and including each of 260° C. and 550° C.

11. In a crystal-growth autoclave having a chamber wall defining an interior cavity including a crystal-growth zone and a nutrient-dissolution zone situated above, and in fluid communication with, the crystal-growth zone, a method of hydrothermally synthesizing sapphire single crystals uniformly doped with titanium (III) comprising the steps of:

disposing within the crystal-growth zone at least one sapphire-based seed crystal;

disposing within the nutrient-dissolution zone an aluminum-containing material to serve as nutrient;

introducing into the cavity an amount of acidic, titanium-containing growth solution sufficient to immerse the at least one seed crystal and the nutrient in the growth solution;

maintaining an interior-cavity pressure within a range between and including each of 15 kilopounds per square inch and 25 kilopounds per square inch; and maintaining a temperature differential between the crystal-growth and nutrient-dissolution zones such that the average temperature within the crystal-growth zone is higher than the average temperature within the nutrient-dissolution zone;

wherein the acidic, titanium-containing growth solution is selected such that sapphire exhibits retrograde solubility in the solution.

12. The method of claim 11 wherein the sapphire-based seed crystal comprises one of (a) pure sapphire and (b) titanium-doped sapphire single crystal.

13. The method of claim 12 wherein the material selected as nutrient comprises at least one of (a) ($Al_2O_3$) and (b) titanium (III) sapphire ($Ti^{3+}:Al_2O_3$).

14. The method of claim 13 wherein the acidic growth solution comprises hydrochloric acid.

15. The method of claim 11 wherein the material selected as nutrient comprises at least one of (a) ($Al_2O_3$) and (b) titanium (III) sapphire ($Ti^{3+}:Al_2O_3$).

16. The method of claim 15 wherein the acidic growth solution comprises hydrochloric acid.

17. The method of claim 11 wherein the acidic growth solution comprises hydrochloric acid.

18. The method of claim 11 wherein the average temperature differential between the average temperatures of the crystal-growth and nutrient-dissolution zones is maintained within a range of 5° C. and 100° C.

19. The method of claim 11 wherein the average temperature within the crystal-growth zone is maintained within a range between and including each of 400° C. and 700° C. and the average temperature within the nutrient-dissolution zone is maintained within a range between and including each of 260° C. and 550° C.

* * * * *